(12) United States Patent
Rudelic et al.

(10) Patent No.: US 9,384,134 B2
(45) Date of Patent: *Jul. 5, 2016

(54) PERSISTENT MEMORY FOR PROCESSOR MAIN MEMORY

(71) Applicant: MICRON TECHNOLOGY, INC., Boise, ID (US)

(72) Inventors: John Rudelic, Folsom, CA (US); August Camber, Rocklin, CA (US); Mostafa Naguib Abdulla, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/791,030

(22) Filed: Jul. 2, 2015

(65) Prior Publication Data

US 2015/0309931 A1   Oct. 29, 2015

Related U.S. Application Data

(63) Continuation of application No. 12/245,916, filed on Apr. 4, 2014, now Pat. No. 9,075,725, which is a continuation of application No. 12/797,512, filed on Jun. 9, 2010, now Pat. No. 8,694,737.

(51) Int. Cl.
*G06F 12/08* (2016.01)
*G06F 12/10* (2016.01)
*G06F 13/16* (2006.01)
*G11C 11/00* (2006.01)

(52) U.S. Cl.
CPC .......... *G06F 12/084* (2013.01); *G06F 12/0811* (2013.01); *G06F 12/0895* (2013.01); *G06F 12/1027* (2013.01); *G06F 13/1694* (2013.01); *G06F 2212/2022* (2013.01); *G06F 2212/283* (2013.01); *G06F 2212/314* (2013.01); *G06F 2212/682* (2013.01); *G11C 11/005* (2013.01)

(58) Field of Classification Search
CPC .............. G06F 12/084; G06F 12/0895; G06F 13/1694; G06F 2212/2022; G11C 11/005
See application file for complete search history.

(56) References Cited

U.S. PATENT DOCUMENTS

| | | | |
|---|---|---|---|
| 5,442,704 | A | 8/1995 | Holtey |
| 5,778,429 | A | 7/1998 | Sukegawa et al. |
| 6,003,142 | A | 12/1999 | Mori |
| 6,658,539 | B2 | 12/2003 | Arimilli et al. |
| 8,055,847 | B2 | 11/2011 | Cantin, Jr. |
| 8,180,981 | B2 | 5/2012 | Kapil et al. |

(Continued)

FOREIGN PATENT DOCUMENTS

| | | |
|---|---|---|
| CN | 1504902 | 6/2004 |
| CN | 1864140 | 11/2006 |

(Continued)

OTHER PUBLICATIONS

Chinese Office Action dated Sep. 29, 2013 in corresponding Chinese Appl. No. 201110159792.3, filed Jun. 9, 2011, 13 pages.

(Continued)

*Primary Examiner* — Ryan Bertram
(74) *Attorney, Agent, or Firm* — Brooks, Cameron & Huebsch, PLLC

(57) ABSTRACT

Subject matter disclosed herein relates to a system of one or more processors that includes persistent memory.

20 Claims, 3 Drawing Sheets

(56) References Cited

U.S. PATENT DOCUMENTS

| | | |
|---|---|---|
| 2003/0005237 A1 | 1/2003 | Dhong et al. |
| 2004/0158742 A1 | 8/2004 | Srinivasan et al. |
| 2004/0242029 A1 | 12/2004 | Nakamura et al. |
| 2005/0160229 A1 | 7/2005 | Johns et al. |
| 2005/0166020 A1 | 7/2005 | Jamil et al. |
| 2006/0026569 A1 | 2/2006 | Oerting et al. |
| 2006/0156064 A1 | 7/2006 | Damani et al. |
| 2006/0265544 A1 | 11/2006 | Rudelic |
| 2007/0113044 A1 | 5/2007 | Day et al. |
| 2007/0226795 A1 | 9/2007 | Conti et al. |
| 2008/0082766 A1 | 4/2008 | Okin et al. |
| 2008/0320224 A1 | 12/2008 | Kiyota |
| 2009/0037666 A1 | 2/2009 | Rahman et al. |
| 2009/0158000 A1 | 6/2009 | Takahashi |
| 2010/0058046 A1 | 3/2010 | John et al. |
| 2010/0064111 A1 | 3/2010 | Kunimatsu et al. |
| 2010/0211742 A1 | 8/2010 | Turullols et al. |
| 2010/0293317 A1 | 11/2010 | Confalonieri et al. |
| 2011/0093646 A1 | 4/2011 | Koka et al. |
| 2011/0307653 A1 | 12/2011 | Rudelic et al. |
| 2011/0307665 A1 | 12/2011 | Rudelic et al. |

FOREIGN PATENT DOCUMENTS

| | | |
|---|---|---|
| CN | 101131624 | 2/2008 |
| JP | H03-58163 | 3/1991 |
| JP | 6-150031 | 5/1994 |
| JP | H08-16470 | 1/1996 |
| JP | 8-95861 | 12/1996 |
| JP | 10-161930 | 6/1998 |
| JP | 2004-521434 | 7/2004 |
| JP | 2004-334996 | 11/2004 |
| JP | 2006-323739 | 11/2006 |
| JP | 2009-295156 | 12/2009 |
| KR | 10-2002-0097145 | 12/2002 |
| KR | 10-2010-0053540 | 5/2010 |
| TW | 200622905 | 7/2006 |
| TW | 200710722 | 3/2007 |
| TW | 201017408 | 5/2010 |
| TW | 201017421 | 5/2010 |
| WO | WO 01/50269 | 7/2001 |
| WO | WO 2006/107095 | 10/2006 |
| WO | WO 2007/105256 | 9/2007 |
| WO | WO 2009/017890 | 2/2009 |

OTHER PUBLICATIONS

Chinese Office Action dated May 23, 2014 in corresponding Chinese Appl. No. 201110159792.3, filed Jun. 9, 2011, 4 pages.
Desikan, R., "On-chip MRAM as High-Bandwidth, Low-Latency Replacement for DRAM Physical Memories," Nov. 27, 2002, Department of Computer Sciences, University of Texas Austin.
German Office Action dated Mar. 27, 2013 in corresponding German Appl. No. 102011076894.7, filed Jun. 1, 2011, 7 pages.
Intel Corp, "An introduction to the Intel QuickPath Interconnect" Jan. 2009, pp. 1-22, Document No. 320412-001US, Intel Corporation.
Japanese Decision of Rejection dated Dec. 24, 2013 in corresponding Japanese Appl. No. 2011-110233, filed May 17, 2011, 4 pages.
Japanese Notice of Rejection Grounds dated May 21, 2013 in corresponding Japanese Appl. No. 2011-110233, filed May 17, 2011, 5 pages.
Japanese Pre-Appeal Reexamination Report dated Jun. 20, 2014 in corresponding Japanese Appl. No. 2011-110233, filed May 17, 2011, 5 pages.
Korean Preliminary Rejection dated Apr. 15, 2013 in corresponding Korean Appl. No. Oct. 2011-54932, filed Jun. 8, 2011, 7 pages.
Lee, B.C. et al., "Phase-Change Technology and the Future of Main Memory," IEEE Computer Society, Jan./Feb. 2010, pp. 131-141.
Patterson, D.A. et al.: Computer Architecture a Quantitative Approach, $2^{nd}$ Ed., Morgan Kaufmann Publishers, Inc. 1996, p. 654-693.
Sinharoy, B. et al., "Powers System Microarchitecture," IBM Journal of Research and Development—POWER 5 and packing. vol. 49, Jul. 2005, p. 505-521.
Wu, X. et al., "Hybrid Cache Architecture with Disparate Memory Technologies," ISCA 2009 Proceedings of the $36^{th}$ Annual International Symposium on Computer Architecture, p. 34-45.
U.S. Appl. No. 12/797,522, filed Jun. 9, 2010.
Taiwan Office Action dated Dec. 27, 2014 in corresponding Taiwan Appl. No. 100120246, Filed Jun. 9, 2010, 15 pages.

PERSISTENT MEMORY FOR PROCESSOR MAIN MEMORY

REFERENCE TO RELATED APPLICATIONS

This application is a continuation of U.S. patent application Ser. No. 14/245,916, filed Apr. 4, 2014, entitled "PERSISTENT MEMORY FOR PROCESSOR MAIN MEMORY," which is a continuation of U.S. patent application Ser. No. 12/797,512, filed Jun. 9, 2010, entitled "PERSISTENT MEMORY FOR PROCESSOR MAIN MEMORY," both of which are hereby incorporated herein by reference in their entireties.

BACKGROUND

1. Field

Subject matter disclosed herein relates to a system of one or more processors that includes persistent memory.

2. Information

Central processing units (CPUs) are employed in many types of electronic devices, such as computers, cell phones, PDA's, data loggers, games, and navigational equipment, for example. Among such electronic devices, various configurations of one or more CPUs may be employed, such as in a multi-processor system, for example. CPUs may be associated with memory devices to carry out particular functions. For example, a CPU may be associated with a main memory to maintain one or more applications hosted by the CPU. In another example, a CPU may be associated with cache memory to provide relatively fast access to various types of stored information.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
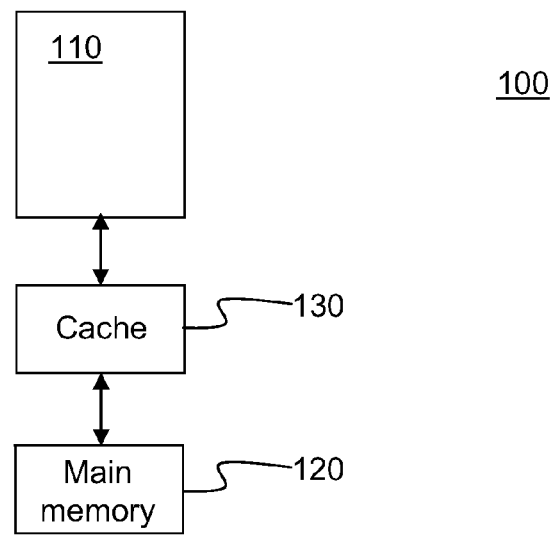
FIG. 1 is a schematic diagram of a system configuration, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a system of two or more processing entities, such as central processing units (CPUs), may comprise persistent memory. For example, persistent memory may be used for at least a portion of main memory, which may be shared among multiple CPUs. Such a system of CPUs, for example, may comprise a computing system to execute applications in any of a number of environments, such as computers, cell phones, PDA's, data loggers, and navigational equipment, just to name a few examples. In particular, multiple applications may be executed simultaneously by multiple CPUs. In an implementation, one or more such CPUs may be individually associated with a main memory and/or cache memory. Here, a portion of either such main memory or cache memory may comprise persistent memory. For example, a main memory and/or cache memory may comprise a portion of persistent memory and a portion of other type of random access memory (RAM). In a particular example, main memory may include at least a portion of phase change memory (PCM) and dynamic random access memory (DRAM). In another particular example, cache memory may comprise PCM and/or DRAM. Such memory configurations may provide benefits such as non-volatility, relatively high program/read speeds, and/or extended PCM life, for example, as explained below. Main memory that includes persistent memory may provide another benefit such as avoiding a need to load executable instructions and/or other information from a nonvolatile memory into volatile DRAM, for example. Accordingly, increased memory operation speed (e.g., read, write, or erase operations) and/or reduced memory device power consumption may be among a number of advantages provided by main memory that includes persistent memory. Of course, such features and details of an embodiment that includes PCM or other persistent memory as a main memory are merely examples, and claimed subject matter is not so limited.

Herein, persistent memory refers to nonvolatile memory such as PCM, which may have a bit alterable capability. Another feature of persistent memory includes non-symmetrical read/write speeds, wherein program speed may be slower than read speed for a given memory cell. As explained below, a presence of persistent memory having such features in a multi-processor system may utilize particular cache coherence protocols to allow one or more processing entities to share main memory, for example. Herein, main memory refers to memory that is used by a processing entity to maintain one or more applications that are executable by the processing entity, though claimed subject matter is not limited in this respect.

In an embodiment, PCM may be used as main memory for a system of one or more processing entities. In such a case, PCM may involve at least some of the same cache coherence protocols that apply to DRAM or other types of RAM, for example. However, PCM may be different from DRAM in the sense that PCM comprises a persistent memory. For example, DRAM may lose stored contents if power is removed, while PCM may maintain stored contents even if power is removed. In another example, read and program speeds may be the same for DRAM, whereas read and program speeds for PCM may be different from one another and relatively slow, compared to DRAM. Thus, in an implementation, cache coherency semantics may be added to cache coherency management to support a nonvolatile characteristic of PCM if PCM comprises at least a portion of main memory. In another implementation having PCM comprising at least a portion of main memory, cache coherency semantics may be added to cache coherency management to support relatively long, non-symmetrical read/write speeds of PCM to accommodate added latency of a program operation compared to a read operation. Of course, claimed subject matter is not limited to such particular features of DRAM or PCM.

In an embodiment, a memory device may comprise a main memory having at least one interface to connect, via a bus for example, to multiple processors. In one implementation, such processors may include an on-board (e.g., embedded) cache.

Such processors may further include a register such as a translation lookaside buffer (TLB), which is described below. At least a portion of main memory may comprise persistent memory. Such a memory device may further comprise a memory controller to retrieve information from a persistent main memory to initialize the on-board cache in the multiple processors, as explained in detail below.

In another embodiment, a method of using a particular memory device may comprise sharing a main memory among multiple processors. In one implementation, such processors may include an on-board cache, which may comprise a register such as a TLB. At least a portion of main memory may comprise persistent memory. For example, such persistent memory may comprise PCM.

A method of using a particular memory device may further comprise storing information in such persistent main memory. For example, such storing may occur while main memory and/or one or more of the multiple processors are powered-down, after which a TLB initialization may occur, as explained below. Accordingly, a method of using a particular memory device may further comprise retrieving stored information from persistent main memory to initialize the TLB.

In an implementation, a TLB may comprise a CPU cache utilized by memory management hardware to improve virtual address translation speed, for example. A TLB may be implemented as content-addressable memory (CAM). In such a case, a CAM search key may comprise a virtual address and a search result may comprise a physical address. If, for example, a requested address is present in a TLB, a CAM search may yield a match relatively quickly, resulting in a retrieved physical address usable to access memory. If, however, the requested address is not in a TLB, a resulting process may include reading contents of multiple memory locations and using at least a portion of the read contents to determine a physical address, for example.

In general, writing or programming processes may be used to store information in memory devices, while a read process may be used to retrieve stored information. Stored information may be erased from all or a portion of a memory device and/or new information may be written into all or a portion of a memory device. Relatively large numbers of such program-erase and/or program-re-program cycles may degrade the physical integrity of a PCM. For example, thousands of program-erase cycles imposed on a main memory that incorporates PCM may reduce a reliability of the main memory. If using such PCM memory, it may be beneficial to limit and/or reduce the number of occurrences of program-erase cycles, or "cycling", that a PCM main memory may otherwise be subjected to. Accordingly, in one embodiment, a technique to manage cycling of a main memory incorporating PCM may comprise caching write information. Thus, in addition to providing benefits of improved processor system performance in terms of speed and efficiency, cache memory may also provide a method for reducing PCM cycling to extend life of PCM main memory. In particular, a memory device, such as a DRAM cache memory, may be used to cache write information corresponding to particular addresses of a PCM main memory. A memory size of such a DRAM cache memory may be selected based, at least in part, on properties of PCM included in a main memory. Such properties may include, for example, cycling specifications of PCM, PCM failure rate, PCM write speed, write usage model of a system incorporating a PCM main memory, and/or PCM write wear leveling techniques used. Though the particular use of PCM is cited, such a technique of managing cycling of a main memory incorporating any of a number of memory types may similarly comprise caching write information, as described above. Accordingly, claimed subject matter is not so limited to such details.

FIG. 1 is a schematic block diagram of a processing system 100, according to an embodiment. Processing system 100 may comprise CPU 110, main memory 120, and/or cache 130. In particular, CPU 110 may host one or more applications maintained in main memory 120. Though not shown in FIG. 1, processing system 100 may comprise additional CPUs or other such processing entities, additional main memories, and/or additional caches. For example, CPU 110, main memory 120, and/or cache 130 may collectively comprise building blocks for larger multiprocessor systems. In one implementation, processing system 100 may operate using a memory hierarchy that includes one or more levels of cache memory. Any such level may comprise persistent memory shared among multiple CPUs. For example, cache memory may comprise first level cache and second level cache, either of which at least a portion may comprise persistent memory. Of course, such details of a processing system and cache memory are merely examples, and claimed subject matter is not so limited. In an embodiment, at least a portion of main memory 110 may comprise persistent memory. In a particular implementation, another portion of main memory 110 may comprise other types of memory, such as volatile DRAM. Portions of persistent memory need not be arranged contiguously in main memory 210, which may comprise one or more die structures, for example.

Figure 2:
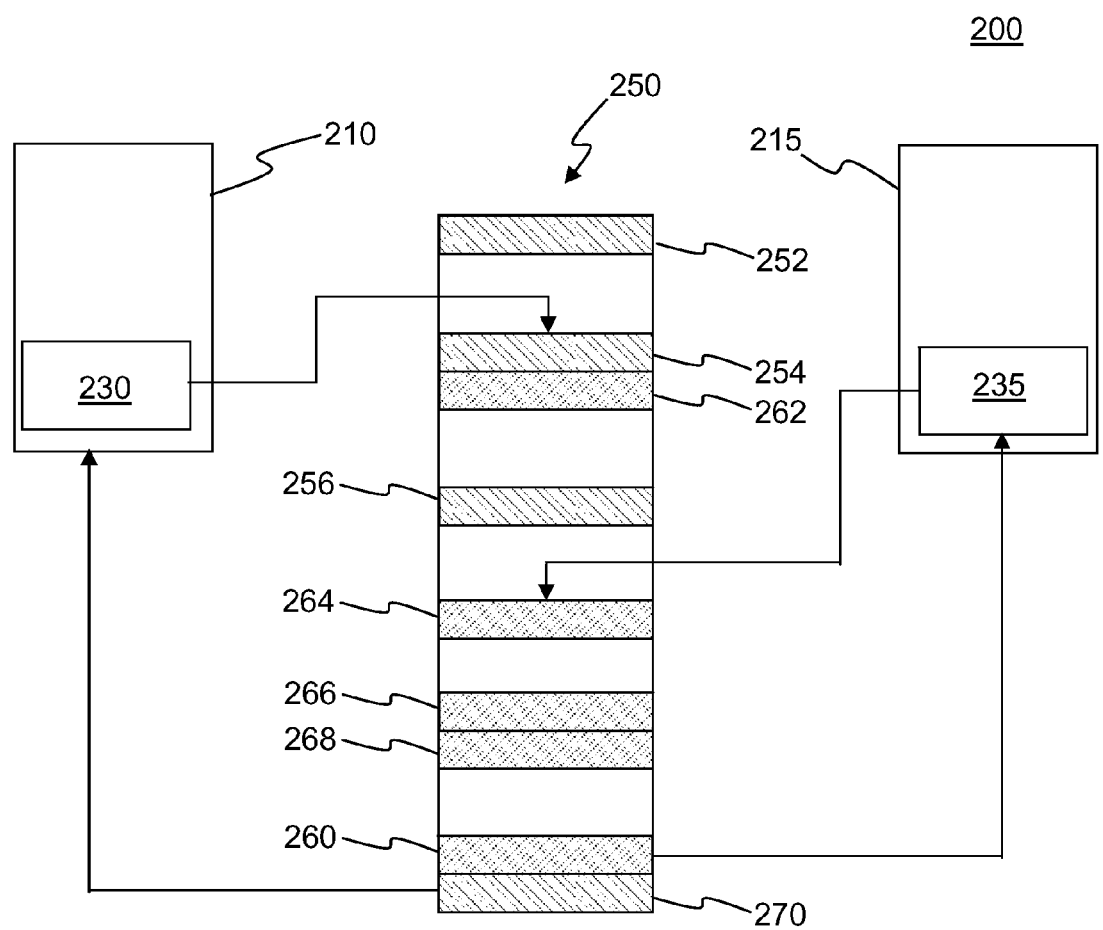
FIG. 2 is a schematic diagram of a multi-processor system, according to an embodiment.

FIG. 2 is a schematic block diagram of a multi-processor system 200, according to an embodiment. Such a multi-processor system may include any number of processing entities, though only two such entities are shown in FIG. 2. In a particular example, such processing entities may comprise a first CPU 210 associated with a cache 230 and a second CPU 215 associated with a cache 235. In one implementation, first CPU 210 and second CPU 215 may each include local memory (not shown) comprising embedded persistent memory, for example. In another implementation, first CPU 210 and second CPU 215 may share a main memory 250 that includes persistent memory. In particular, persistent memory may be included in a memory hierarchy comprising caches (e.g., various levels of cache) and main memory. At least a portion of such main memory, for example, may comprise PCM. Such a memory hierarchy may be used to manage a distributed memory comprising caches and main memory. First CPU 210 and second CPU 215 (and other CPUs that may be present in a computer platform, for example) may share such a distributed memory. In such a case, persistent memory may be included in a one-hop local memory, or multi-hop distributed and shared memory on another (e.g., a third) CPU or a memory hierarchy that may be shared among CPU 210 and second CPU 215, for example.

In one implementation, multi-processor system 200 may comprise a portion of a computing platform, wherein main memory 250 may be used as virtual memory associated with a paging process. In such an implementation, both caches 230 and 235 may comprise a TLB, which may point to a particular page table that, in turn, may point to one or more individual pages. For example, cache 230, comprising a TLB, may point to page table 254 and, in turn, page table 254 may point to page 252 and page 256. Also, cache 235, comprising a TLB, may point to page table 264 and, in turn, page table 264 may point to page 262, page 266, and page 268. In a particular implementation, such TLBs in a CPU (e.g., caches 230 and 235) may comprise a register that is not persistent. Thus, for example, upon power-down, such TLBs may lose stored information. After such a power-down, TLBs may be initialized during a process to boot CPUs and/or TLBs. In one implementation, a TLB may comprise a register included in a processor. Such a TLB may point to a base of a page table in main memory, for example. Such a TLB may be initialized with pointers to main memory. The processor may use information maintained in the TLB for fast lookups.

In a case where such a TLB comprises a persistent memory, the TLB need not be initialized upon boot-up subsequent to a power down, for example. In a case wherein at least a portion of main memory comprises persistent memory, the TLB may be initialized using information stored in a particular location of main memory. Again, such initialization may be performed upon boot-up subsequent to a power down, though claimed subject matter is not so limited. For example, one technique to initialize a TLB may involve storing a copy of TLB information in a particular location in persistent main memory 250. In such a case, upon initialization, individual CPUs 210 and/or 215 may copy respective TLB information from a particular location in persistent main memory 250 to the processor's associated TLB. For example, upon initialization, CPU 210 may copy TLB information from page 270 in persistent main memory 250 to the processor's associated TLB, such as cache 230. Also, upon initialization, CPU 215 may copy TLB information from page 260 in persistent main memory 250 to the processor's associated TLB, such as cache 235. After carrying out such a technique, persistent main memory 250 may also be initialized. One reason for such initialization may be because once a TLB is initialized, persistent main memory may be, by definition, initialized due to the fact that a page table base and/or page table entries may remain valid and persistent in persistent memory. Of course, such details of multi-processor system 200 are merely examples, and claimed subject matter is not so limited.

Figure 3:
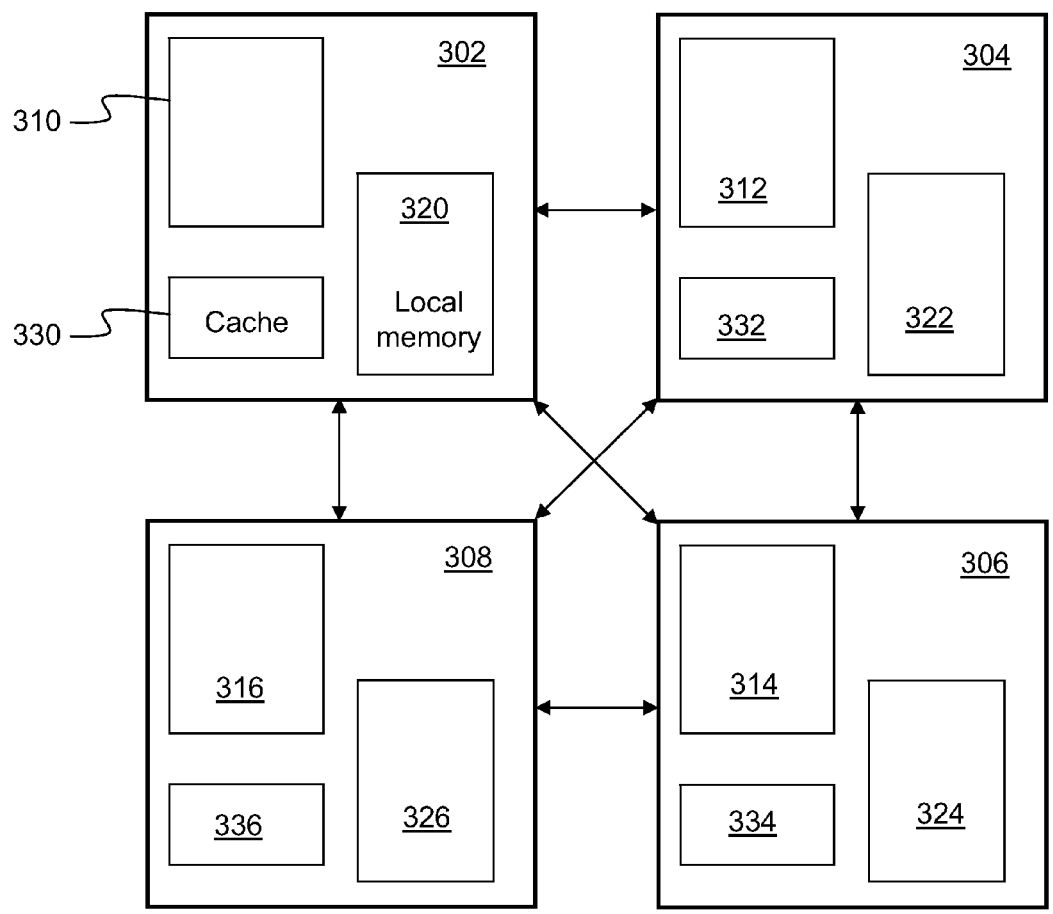
FIG. 3 is a schematic diagram of a multi-processor system configuration, according to another embodiment.

FIG. 3 is a schematic diagram of a multi-core system 300, according to an embodiment. Such a system may comprise processor nodes 302, 304, 306, and 308 connected to one another via one or more buses, for example. In one implementation, multi-core system 300 may comprise a shared memory multiprocessor. Individual processor nodes 302, 304, 306, and 308 may include CPUs 310, 312, 314, and 316, cache memories 330, 332, 334, and 336, and/or local memories 320, 322, 324, and 326, respectively. Within particular processor nodes, such local memories may comprise main memories associated with processors of the particular processor nodes. For example, local memory 320 may comprise a main memory associated with processor 310 in processor node 302. In an implementation, local memories may be shared, or accessed, by CPUs of other processor nodes. One or more local memories 320, 322, 324, and 326 may comprise all or at least a portion of persistent memory. In a particular implementation, a portion of local memory may comprise various types of memory, such as volatile DRAM. Portions of persistent memory need not be arranged contiguously in local memory, which may comprise one or more die structures, for example. Though not shown, processor units may include memory controllers that are integrated on a same die as CPUs or on separate dies, for example. Also, though FIG. 3 shows a system having four nodes, any number of nodes may be included and claimed subject matter is not limited to this particular arrangement.

Cache memories 330, 332, 334, and 336 may comprise relatively high-speed memory for storing a copy of information obtained from any of local memories 320, 322, 324, and 326. In one implementation, at least a portion of one or more cache memories 330, 335, 334, and 336 may comprise persistent memory. Such cache memory may be searched using at least a portion of an address of individual local memories, for example. Such a portion of memory address used for searching cache memory is referred to as a cache index portion. For example, cache memory 330 may comprise a cache index portion and a cache data portion. The cache index portion may include line addresses of information stored in cache memory 330 and cache state information, as described above, for example. Of course, such details of a multi-core system are merely examples, and claimed subject matter is not so limited.

Figure 4:
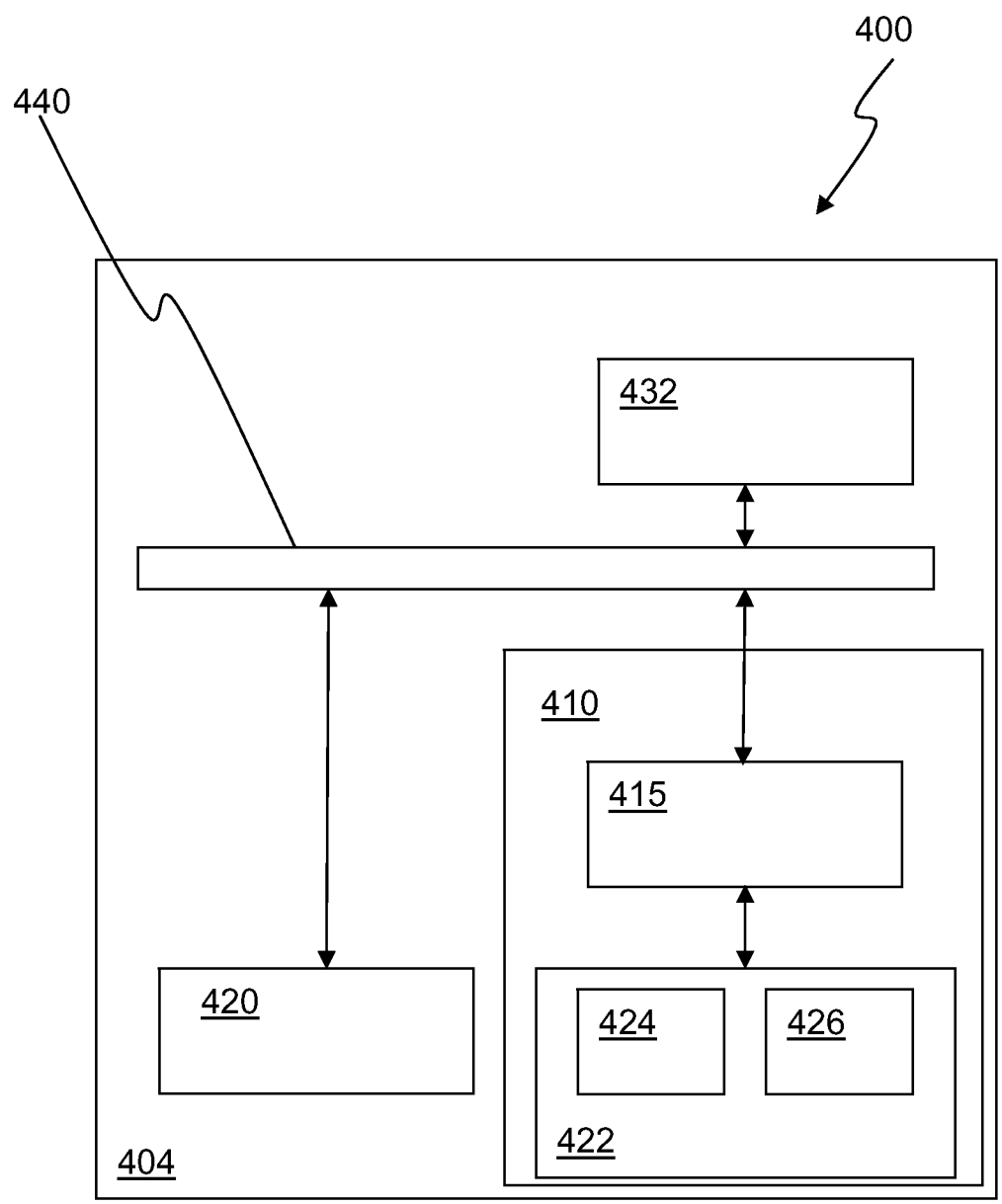
FIG. 4 is a schematic view of a computing system and a memory device, according to an embodiment.

FIG. 4 is a schematic diagram illustrating an exemplary embodiment of a computing system 400 including a memory device 410. A computing device 404 may be representative of any device, appliance, or machine that may be configurable to manage memory device 410. Memory device 410 may include a memory controller 415 and a memory 422. By way of example but not limitation, computing device 404 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

In an embodiment, computing device 404 may include one or more processing units 420 operatively coupled to memory 422 through a bus 440 and a host or memory controller 415. Processing unit 420 is representative of one or more circuits configurable to perform at least a portion of a data computing procedure or process. By way of example but not limitation, processing unit 420 may include one or more processors, controllers, microprocessors, microcontrollers, application specific integrated circuits, digital signal processors, programmable logic devices, field programmable gate arrays, and the like, or any combination thereof. Processing unit 420 may communicate with memory controller 415 to process memory-related operations, such as read, write, and/or erase, as well as memory partition processes discussed above, for example. Processing unit 420 may include an operating system adapted to communicate with memory controller 415. Such an operating system may, for example, generate commands to be sent to memory controller 415 over bus 440. Such commands may include read/write instructions, for example.

Memory 422 is representative of any data storage mechanism. Memory 422 may include, for example, a DRAM 424 and/or a persistent memory 426. In a particular embodiment, memory 422 may comprise a main memory that includes at least a portion of persistent memory, as described above. Memory 422 may also comprise cache memory that may likewise include at least a portion of persistent memory. While illustrated in this example as being separate from processing unit 420, it should be understood that all or part of DRAM 424 may be provided within or otherwise co-located/coupled with processing unit 420.

According to an embodiment, one or more portions of memory 422 may store signals representative of data and/or information as expressed by a particular state of memory 422. For example, an electronic signal representative of data and/or information may be "stored" in a portion of memory 422 by affecting or changing the state of such portions of memory 422 to represent data and/or information as binary information (e.g., ones and zeros). As such, in a particular implementation, such a change of state of the portion of memory to store a signal representative of data and/or information constitutes a transformation of memory 422 to a different state or thing.

In one embodiment, system 400 may comprise two or more processing units 420 and main memory having at least one interface to connect to such multiple processors having on-board cache (e.g., via bus 440 to processing units 420), wherein at least a portion of main memory may comprise persistent memory. System 400 may further comprise a memory controller to retrieve information from such a persistent main memory to initialize the on-board cache. Such persistent memory may comprise PCM, for example.

Computing device 404 may include, for example, an input/output 432. Input/output 432 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 432 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A system comprising:
    a plurality of processor nodes, wherein at least one processor node comprises:
        a processor; and
        a first level cache memory and a second level cache memory, wherein the first level cache memory comprises a first level persistent cache memory and the second level cache memory comprises a second level persistent cache memory,
        wherein the first level persistent cache memory and the second level persistent cache memory are accessible by at least one other processor node of the plurality of processor nodes.

2. The system of claim 1, wherein the at least one processor node further comprises a main memory associated with the at least one processor node, wherein the main memory comprises a persistent main memory.

3. The system of claim 2, wherein the persistent main memory is on a plurality of dies.

4. The system of claim 2, wherein the main memory comprises volatile memory.

5. The system of claim 2, wherein at least one of the first level cache memory and the second level cache memory comprises a cache index portion configured to store an address corresponding to a location in the main memory.

6. The system of claim 2, wherein the persistent main memory is accessible by at least one other processor node of the plurality of processor nodes.

7. The system of claim 1, wherein both the first level persistent cache memory and the second level persistent cache memory comprise phase change memory (PCM).

8. The system of claim 1, wherein the first persistent cache memory or the second persistent cache memory is on-board the processor.

9. The system of claim 1, wherein the plurality of processor nodes are connected to one another via a plurality of buses.

10. A method, comprising:
    retrieving information from a first main memory associated with a first processor node of a plurality of processor nodes; and
    loading the information from the first main memory into a first level persistent cache memory or a second level persistent cache memory associated with a second processor node of the plurality of processor nodes.

11. The method of claim 10, wherein retrieving the information from the first main memory comprises retrieving the information from a first persistent main memory.

12. The method of claim 10, wherein the first processor node further comprises a first cache memory comprising a first persistent cache memory.

13. The method of claim 10, wherein loading the information comprises loading the information from the first main memory into a first level persistent cache memory on-board a processor of the second processor node or a second level persistent cache memory on-board the processor of the second processor node.

14. The method of claim 10, wherein the first level persistent cache memory or the second level persistent cache memory further comprises a cache data portion, and wherein loading the information comprises loading the information from the first main memory into the cache data portion.

15. The method of claim 10, wherein the first level persistent cache memory or the second level persistent cache memory further comprises a cache index portion, and the method further comprises searching the cache index portion using at least a portion of an address of the first main memory.

16. The method of claim 10, wherein the second processor node further comprises a second main memory comprising a second persistent main memory associated with the second processor node.

17. The method of claim 16, further comprising retrieving information from the second persistent main memory and loading the information from the second persistent main memory into a first persistent cache memory of the first processor node.

18. The method of claim 16, wherein the first cache memory comprises a cache index portion, and the method further comprises searching the cache index portion using at least a portion of an address of the second main memory.

19. The method of claim 16, further comprising:
    retrieving information from the second persistent main memory;
    loading the information from the second persistent main memory into a first persistent cache memory associated with the first processor node,
    wherein the first persistent cache memory further comprises a first level persistent cache memory and a second level persistent cache memory associated with the first processor node, and
    wherein loading the information from the second persistent main memory into the first persistent cache memory comprises loading the information into the first level persistent cache or the second level persistent cache memory associated with the first processor node.

20. The method of claim 10, wherein retrieving information from the first main memory comprises retrieving information from a first persistent main memory residing on a plurality of dies.

* * * * *